United States Patent
Nakazato et al.

(10) Patent No.: US 7,768,431 B2
(45) Date of Patent: Aug. 3, 2010

(54) R/D CONVERTER AND ANGLE DETECTING APPARATUS

(75) Inventors: Kenichi Nakazato, Tokyo (JP); Hisashi Nishimura, Tokyo (JP)

(73) Assignee: Japan Aviation Electronics Industry Limited, Tokyo (JP)

(*) Notice: Subject to any disclaimer, the term of this patent is extended or adjusted under 35 U.S.C. 154(b) by 0 days.

(21) Appl. No.: 12/317,095

(22) Filed: Dec. 19, 2008

(65) Prior Publication Data

US 2009/0160687 A1  Jun. 25, 2009

(30) Foreign Application Priority Data

Dec. 21, 2007  (JP) ............... 2007-330399

(51) Int. Cl.
*H03M 1/48* (2006.01)
(52) U.S. Cl. ........................................ 341/116
(58) Field of Classification Search ................. 341/112, 341/111, 116
See application file for complete search history.

(56) References Cited

U.S. PATENT DOCUMENTS 4,468,745 A * 8/1984 Kjosavik .................. 702/151
4,857,926 A * 8/1989 Neglia et al. ................ 341/116
6,278,388 B1 * 8/2001 Kushihara .................. 341/112

FOREIGN PATENT DOCUMENTS

| JP | 2000-353957 | 12/2000 |
| JP | 2003-153496 | 5/2003 |
| JP | 2006-058232 | 3/2006 |
| JP | 2007-114165 | 5/2007 |

OTHER PUBLICATIONS

Office Action for priority application JP 2007-330399 issued Oct. 6, 2009.
Extended European Search Report issued Feb. 1, 2010 for corresponding EP patent application No. 08 021 615.3.
Yim et al., "A Resolver-to-Digital Conversion Method for Fast Tracking," IEEE Trans. on Industrial Electronics, vol. 39, No. 5, Oct. 1992, pp. 369-377.

* cited by examiner

*Primary Examiner*—Peguy JeanPierre
(74) *Attorney, Agent, or Firm*—David N. Lathrop

(57) ABSTRACT

A band elimination filter 35 that eliminates or reduces a low frequency noise superposed on resolver signals S1 and S2 is provided between a synchronous detection circuit 34 that performs synchronous detection by referring to an excitation signal and a controller 36 that controls a digital angle output $\phi$ to make a deviation ($\sin(\theta-\phi)$), which is the output of the synchronous detection circuit, zero.

5 Claims, 4 Drawing Sheets

R/D CONVERTER AND ANGLE DETECTING APPARATUS

TECHNICAL FIELD

The present invention relates to an R/D converter that converts a resolver signal output from a resolver, which detects the angle of rotation of a motor, into a digital angle signal (digital angle output), and an angle detecting apparatus having the R/D converter.

BACKGROUND ART

If disturbance noise is superposed on a resolver signal input from a resolver to an RID converter, the operation of the R/D converter is affected by the disturbance noise, and the digital angle output of the R/D converter have an angle error due to the disturbance noise.

Methods of removing the noise superposed on the resolver signal have been already proposed. For example, in the patent literature 1 (Japanese Patent Application Laid-Open No. 2003-153496), use of a common mode filter inserted in the input stage of an R/D converter is described.

However, the method described in the patent literature 1 assumes that the motor line for supplying the motor current to the motor and the resolver line for drawing the resolver signal from the resolver that detects the angle of rotation of the motor are disposed in parallel with each other. The magnetic field produced around the motor line by the motor current traverses the resolver line to cause induced noise simultaneously in both the first and the second signal as differential signals. To eliminate the induced noise, which is common mode noise, according to the method described in the patent literature 1, a common mode filter is disposed in the input stage of the R/D converter.

Typically, the resolver is disposed close to the motor. Accordingly, the resolver is strongly affected by the magnetic field produced by the motor, and noise due to the magnetic field produced by the motor is superposed on the resolver signal. When the motor is rotating, the magnetic field produced by the motor is in synchronization with the rotation of the motor. Therefore, the superposed noise due to the magnetic field produced by the motor is low-frequency noise. Furthermore, the noise is normal mode noise and therefore cannot be eliminated by the common mode filter described above.

A basic configuration of the RID converter is disclosed in the patent literature 2 (Japanese Patent No. 3442316, Japanese Patent Application Laid-Open No. 2000-353957). However, the patent literature 2 makes no reference to removal of noise.

DISCLOSURE OF THE INVENTION

Issues to be Solved by the Invention

An object of the present invention is to provide an R/D converter capable of eliminating or reducing normal mode noise caused by a magnetic field produced by a motor and thereby reducing an output angle error, and an angle detecting apparatus having the R/D converter.

Means to Solve Issues

To attain the object, noise superposed on a resolver signal by the effect of a magnetic field produced by a motor has been analyzed. Then, it has been found that a noise component in the signal output from a synchronous detector has a peak in the vicinity of the frequency of the excitation signal. Thus, means of eliminating or reducing the noise component is provided in an R/D converter.

BEST MODE FOR CARRYING OUT THE INVENTION

Figure 1:
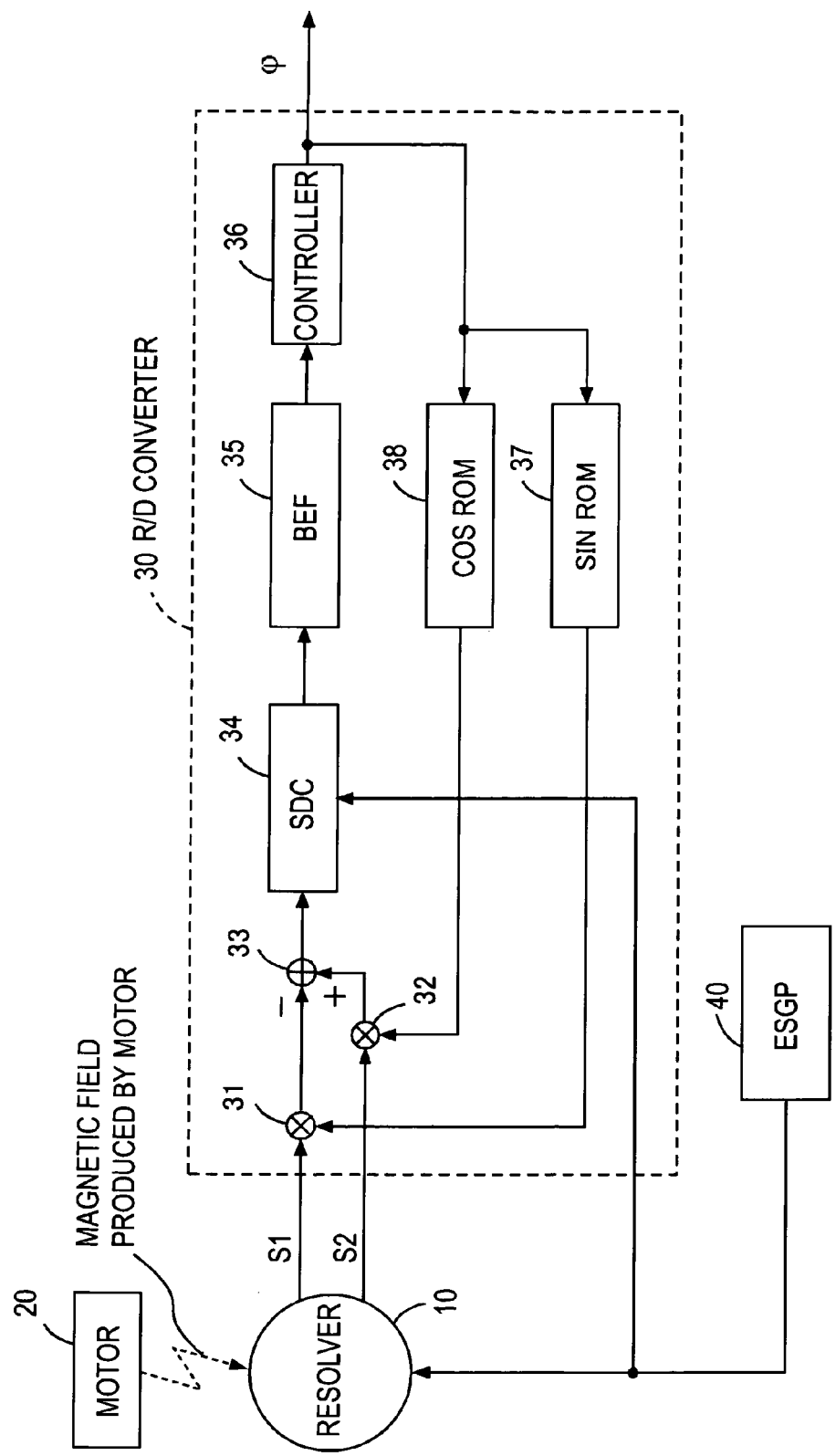
FIG. 1 is a block diagram showing a configuration of an R/D converter and an angle detecting apparatus according to an embodiment of the present invention.

A principle and a preferred embodiment of the present invention will be described with reference to an example shown in the drawings.

FIG. 1 shows an example of the configuration of an R/D converter according to an embodiment of the present invention together with a motor, a resolver, and an excitation signal generating part.

A resolver 10 is of the one-phase-excitation/two-phase-output type and is disposed close to a motor 20. A first resolver signal S1 and a second resolver signal S2 output from the resolver 10 are input to an R/D converter 30. In addition, an excitation signal is input from an excitation signal generating part (ESGP) 40 to the resolver 10 and the R/D converter 30.

Although not shown, the resolver 10 has an excitation signal application coil, a first detecting coil and a second detecting coil. An excitation signal (sin ωt) applied to the excitation signal application coil induces a first resolver signal S1 (cos θ sin ωt) and a second resolver signal S2 (sin θ sin ωt), which are modulated in amplitude, in the first detecting coil and the second detecting coil according to the angle of rotation θ of a rotor of the motor 20 from a predetermined reference position (that is, a detection angle θ) because of magnetic coupling in the resolver, respectively. The resolver signals S1 and S2 have amplitudes of cos θ sin ωt and sin θ sin ωt, respectively, and the amplitude of the resolver signals varies with a change of the rotation angle θ.

In this example, the R/D converter 30 has a first multiplier 31, a second multiplier 32, a subtracter 33, a synchronous detection circuit (SDC) 34, a band elimination filter (BEF) 35, a controller 36, a SIN ROM 37, and a COS ROM 38. As shown in the drawing, the R/D converter 30 has an angle calculation loop, in which an output φ of the controller 36 is applied to the first multiplier 31 and the second multiplier 32 via the SIN ROM 37 and the COS ROM 38, respectively, converts the detection angles θ implied in the resolver signals S1 and S2 into the digital angle output φ, and outputs the digital angle output φ.

The SIN ROM 37 in the R/D converter 30 produces a sine value sin φ from the digital angle output φ and outputs the sine value sin φ to the multiplier 31. The COS ROM 38 produces a cosine value cos φ from the digital angle output φ and outputs the cosine value cos φ to the multiplier 32.

The multiplier 31 multiplies the resolver signal S1 by the sine value sin φ and outputs the product to the subtracter 33, and the multiplier 32 multiplies the resolver signal S2 by the cosine value cos φ and output the product to the subtracter 33. The subtracter 33 subtracts the output of the multiplier 31 from the output of the multiplier 32 and outputs the difference to the synchronous detection circuit 34.

The synchronous detection circuit 34 performs synchronous detection of the output of the subtracter 33 by referring to the excitation signal input from the excitation signal generating part 40 and outputs the detected output to the band elimination filter 35 in this example. The detected output having passed through the band elimination filter 35 is input to the controller 36, and the controller 36 adjusts the digital angle output φ to make the detected output zero, or in other words, to make the deviation sin(θ−φ), which is the detected output, zero. The controller 36 is the same as the compensator 56 and the 12-bit counter 57 described in the patent literature 2, for example. That is, when the deviation sin(θ−φ) is not equal to zero, the digital angle output φ is adjusted to bring the deviation sin(θ−φ) close to zero, thereby converting the detection angle θ into the digital angle output φ. For more detailed information about the control by the controller 36, see the patent literature 2, for example.

Next, there will be specifically described a case where the magnetic field produced by the motor 20 affects the resolver signals S1 and S2 and superposes noise on the resolver signals S1 and S2.

It is supposed that the excitation signal output from the excitation signal generating part 40 is denoted by sin ωt, an angular frequency of the excitation signal is denoted by ω, the detection angle of the resolver is denoted by θ, the rotational angular frequency of the resolver is denoted by α (θ=αt), and the angular frequency of the noise due to the magnetic field produced by the motor 20 is denoted by α'. Then, the resolver signals S1 and S2 are expressed as follows.

$$S2: \sin\alpha t \sin\omega t + \cos\alpha' t \quad (1)$$

$$S1: \cos\alpha t \sin\omega t + \sin\alpha' t \quad (2)$$

If the resolver signals S1 and S2 are input to the R/D converter 30 having the angle calculation loop shown in FIG. 1, the input to the synchronous detection circuit 34 (output of the subtracter 33) is expressed as follows.

$$S2\cos\varphi - S1\sin\varphi = (\sin\alpha t \sin\omega t + \cos\alpha' t)\cos\varphi - \quad (3)$$

$$(\cos\alpha t \sin\omega t + \sin\alpha' t)\sin\varphi$$

$$= (\sin\alpha t \cos\varphi - \cos\alpha t \sin\varphi)$$

$$\sin\omega t + \cos\alpha' t \cos\varphi - \sin\alpha' t \sin\varphi$$

$$= \sin(\alpha t - \varphi)\sin\omega t + \cos(\alpha' t + \varphi)$$

The first term sin(αt−φ) sin ωt in the formula (3) is the component essential for angle calculation, and the second term cos (α't+φ) is the noise component.

If synchronous detection of the signal is performed using the excitation signal sin ωt, the first term in the formula (3) is reduced as follows.

$$\sin(\alpha t - \varphi)\sin\omega t \sin\omega t = \left[\begin{array}{c}\sin(\alpha t - \varphi) \\ \{\cos(\omega t - \omega t) - \cos(\omega t + \omega t)\}\end{array}\right]/2 \quad (4)$$

$$= \{\sin(\alpha t - \varphi)\}/2 - \{\sin(\alpha t - \varphi)\cos(2\omega t)\}/2$$

On the other hand, the second term in the formula (3) is reduced as follows.

$$\cos(\alpha' t + \varphi)\sin\omega t \quad (5)$$

Since the controller 36 adjusts the digital angle output φ to make the deviation sin(θ−φ) zero, φ=αt. In addition, the angular frequency α' of the noise due to the magnetic field produced by the motor 20 is equal to the rotational angular frequency of the motor 20, and the rotational angular frequency of the motor 20 is equal to the rotational angular frequency α of the resolver 10, so that α'=α.

Figure 2:
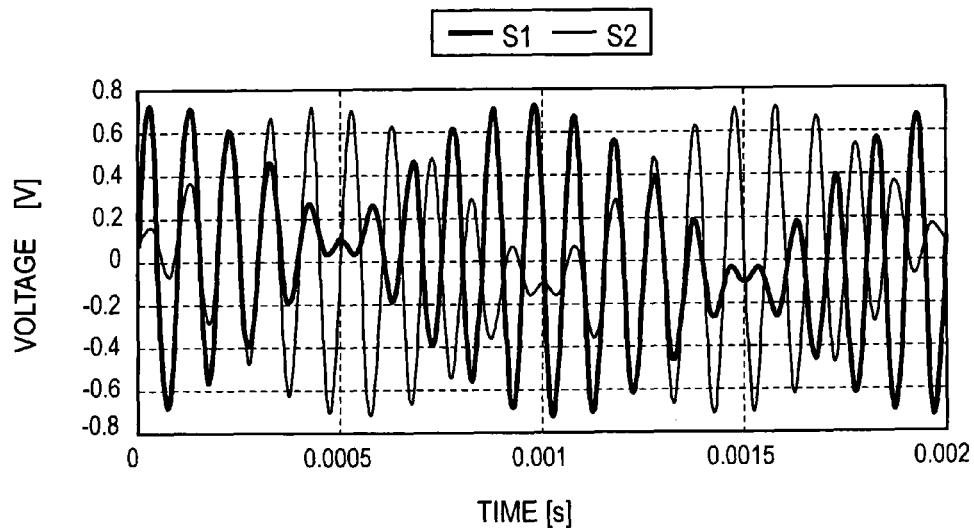
FIG. 2 is a graph showing waveforms of resolver signals S1 and S2.
Figure 3:
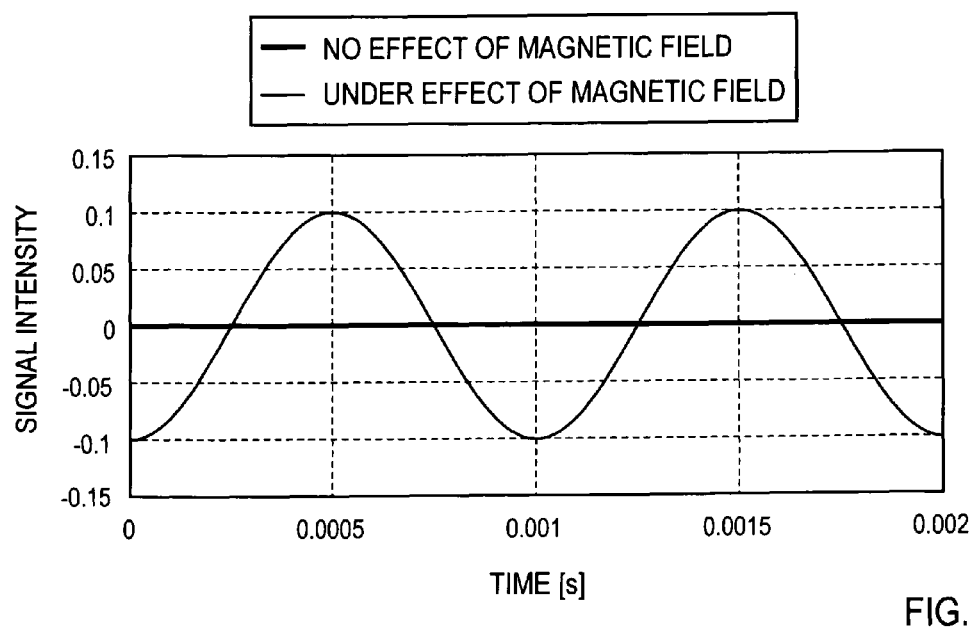
FIG. 3 is a graph showing a waveform before synchronous detection.

FIG. 2 is a graph illustrating the resolver signals S1 and S2 expressed by the formulas (1) and (2) affected by the magnetic field produced by the motor 20 in a case where the frequency of the excitation signal sin ωt is 10 kHz, and the rotational frequency of the motor 20 is 500 Hz. In FIG. 2, the thick line indicates the resolver signal S1, and the thin line indicates the resolver signal S2. FIG. 3 shows a waveform of a signal yet to be subject to synchronous detection expressed by the formula (3) (that is, a waveform of the output of the subtracter 33) in a case where the resolver signals S1 and S2 shown in FIG. 2 are input to the RID converter 30. For the sake of comparison, FIG. 3 also shows a waveform in a case where the magnetic field produced by the motor 20 has no effect on the resolver signals. In FIG. 3, the thin line indicates the waveform in the case where the magnetic field produced by the motor 20 has an effect on the resolver signals, and the thick line indicates the waveform in the case where the magnetic field produced by the motor 20 has no effect on the resolver signals.

As can be seen from FIG. 3, in the case where the magnetic field has an effect, an waveform having a frequency twice as high as the rotational frequency of the motor 20 (=1 kHz) is output. Since φ=αt and α'=α as described above, the noise component expressed by the second term cos(α't+φ) in the formula (3) is reduced to cos(2αt), and therefore, noise (an error signal) having a frequency twice as high as the rotational frequency of the motor 20 is output.

Figure 4:
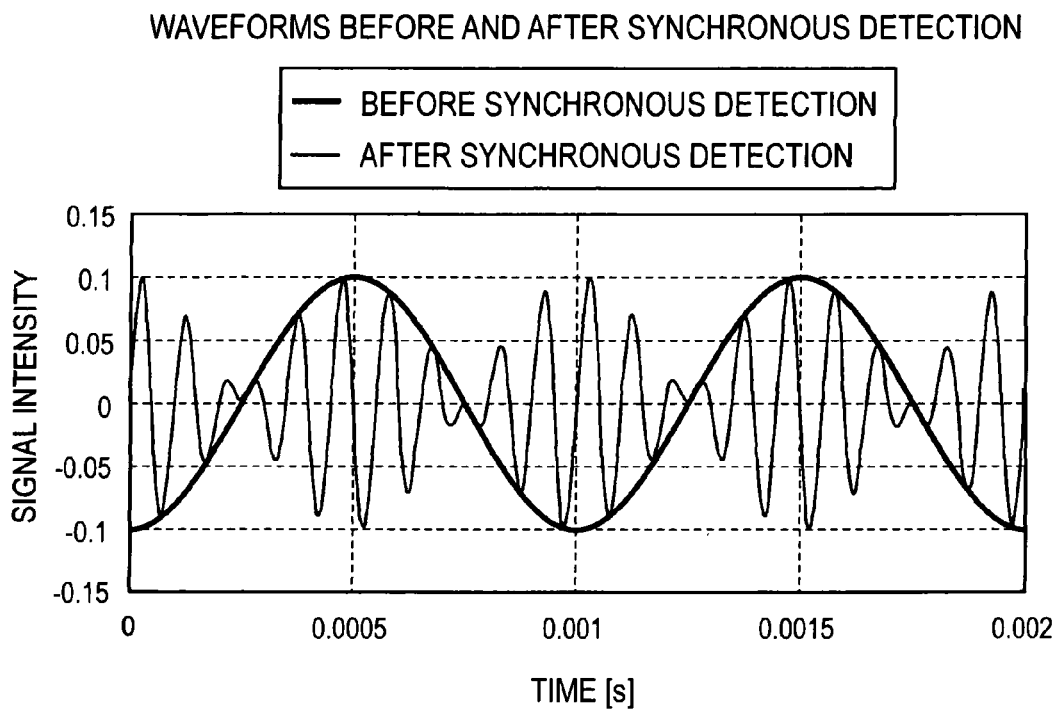
FIG. 4 is a graph showing waveforms before and after synchronous detection.
Figure 5:
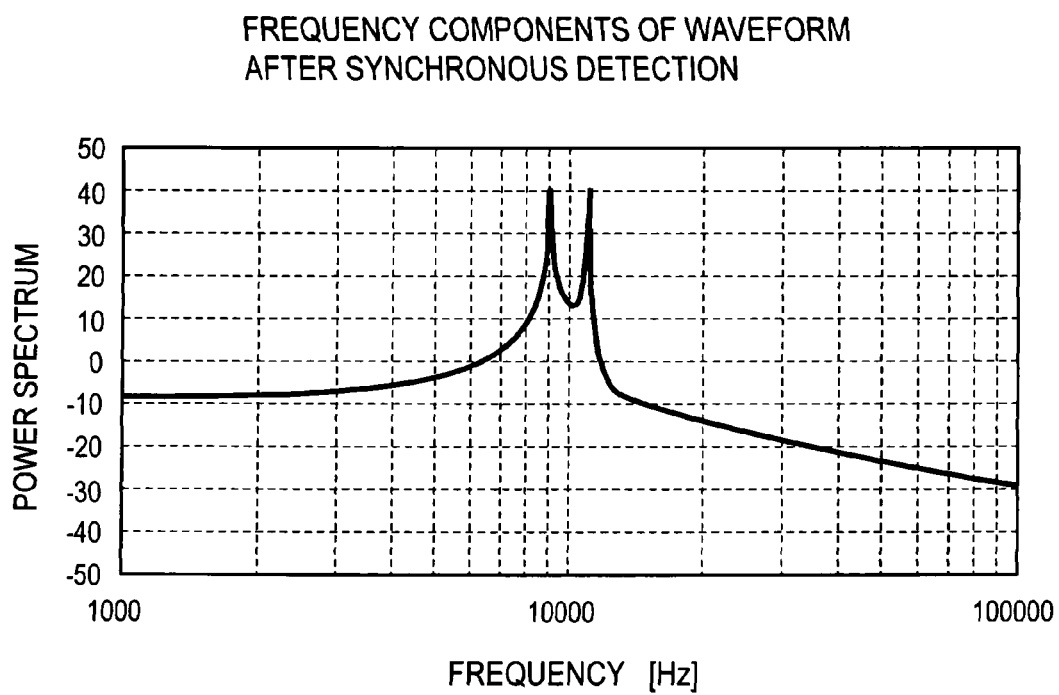
FIG. 5 is a graph showing frequency components of a waveform after synchronous detection.

FIG. 4 shows a waveform before synchronous detection in the case where the magnetic field has an effect shown in FIG. 3 and a waveform after synchronous detection using the excitation signal sin ωt. In FIG. 4, the thick line indicates the waveform before synchronous detection, and the thin line indicates the waveform after synchronous detection. FIG. 5 shows frequency components of the waveform after synchronous detection shown in FIG. 4.

As shown in FIG. 5, the waveform after synchronous detection has peaks at frequencies of 10 kHz±1 kHz. Therefore, if the band elimination filter 35 having a center frequency of 10 kHz, which is the frequency of the excitation signal, is inserted behind the synchronous detection circuit as shown in FIG. 1, the noise component expressed by the second term of the formula (3) can exclusively suppressed. When the band to be controlled by the angle calculation loop is from 0 to 1 kHz, the bandwidth of the band elimination filter 35 is equal to or higher than 2 kHz and equal to or lower than 10 kHz.

The formula (5) expressing the noise after synchronous detection can be reduced as follows by using the sum-ofproducts form of trigonometric functions and the above-described relations of $\phi=\alpha t$ and $\alpha'=\alpha$.

$$\cos(\alpha' t + \varphi)\sin\omega t = \{\sin(\omega t + (\alpha' t + \varphi))\}/2 +$$
$$\{\sin(\omega t - (\alpha' t + \varphi))\}/2$$
$$= \{\sin(\omega + 2\alpha)t)\}/2 + \{\sin(\omega - 2\alpha)t)\}/2$$

Therefore, the noise after synchronous detection has peaks at an angular_frequency equal to the angular_frequency ω of the excitation signal sin ωt plus the angular frequency 2α that is double the rotational angular frequency α of the motor 20 and an angular frequency equal to the angular frequency ω of the excitation signal sin ωt minus the angular frequency 2α that is double the rotational angular frequency α of the motor 20. Therefore, as illustrated in FIG. 5, the noise after synchronous detection has peaks at a frequency equal to the frequency ω/(2π) of the excitation signal sin ωt plus the frequency 2α/(2π) that is double the rotational frequency α/(2π) of the motor 20 and an frequency equal to the frequency ω/(2π) of the excitation signal sin ωt minus the frequency 2α/(2π) that is double the rotational frequency α/(2π) of the motor 20.

The band elimination filter 35 may be any filter that can eliminate or reduce the noise in a band in the vicinity of the frequency of the excitation signal and does not affect the characteristics of the angle calculation loop. For example, it is supposed that the band of the band elimination filter 35 is determined to include the two peaks of the noise after synchronous detection described above. In this case, the bandwidth of the band elimination filter 35 is determined to be equal to or higher than 4α (2×2α) and not to overlap the band of the angle calculation loop, that is, the band of the deviation sin(θ−φ).

Figure 6:
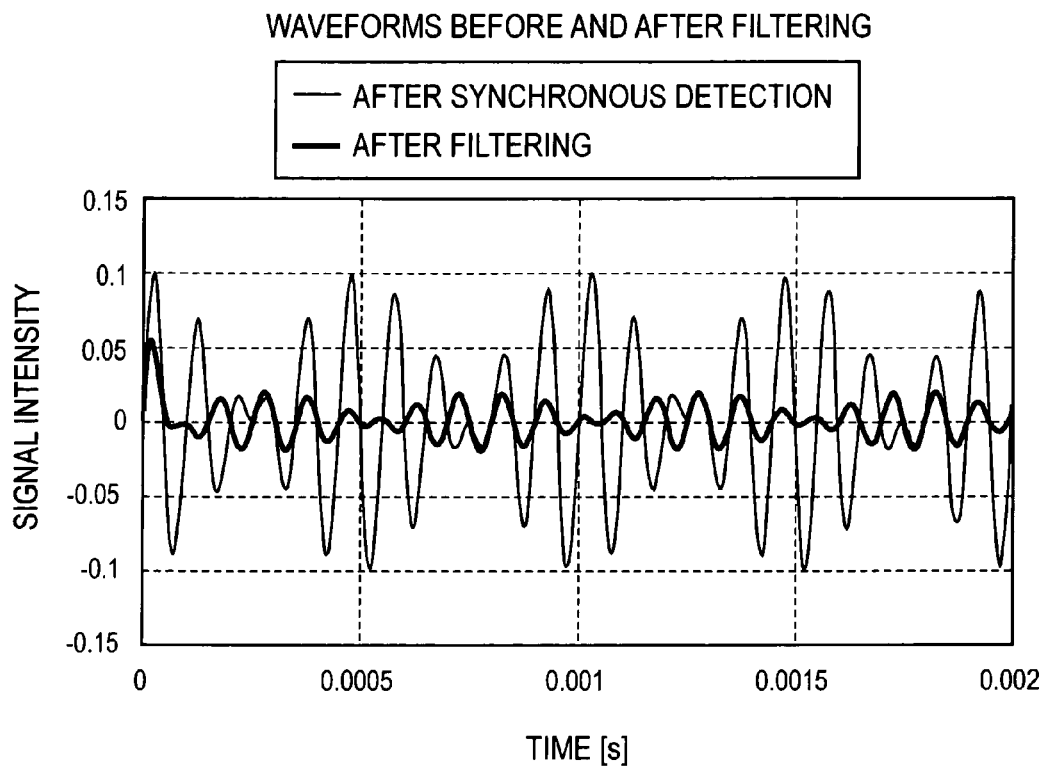
FIG. 6 is a graph showing a waveform before and after filtering.

The band elimination filter 35 may be a notch filter if the Q value of the filter is appropriately selected. FIG. 6 shows a waveform of the signal having passed through the band elimination filter 35 in a case where the band elimination filter 35 is a notch filter having a center frequency $f_n$ of 10 kHz and a Q value of 1 together with the waveform after synchronous detection shown in FIG. 4. In FIG. 6, the thick line indicates the waveform of the signal after passing through the band elimination filter 35, and the thin line indicates the waveform after synchronous detection. As can be seen from FIG. 6, the band elimination filter 35 has an effect of reducing the noise to about one fifth.

Figure 7:
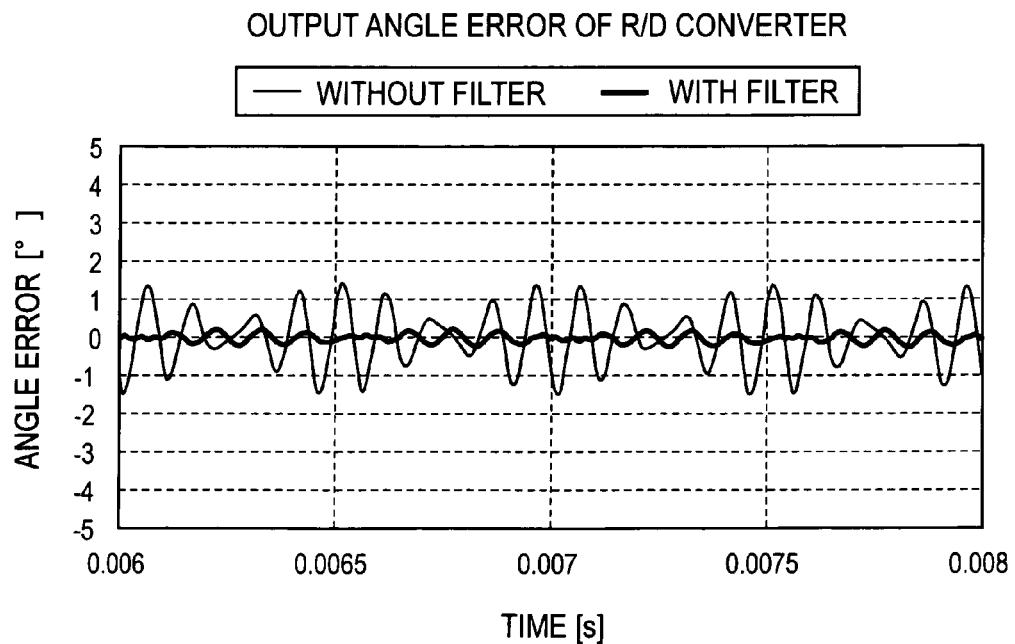
FIG. 7 is a graph showing an output angle error of the R/D converter.

On the other hand, FIG. 7 shows an output angle error of the R/D converter (the difference between the digital angle output φ and the detection angle θ (=αt) of the resolver signals S1 and S2) in the case where the above-described notch filter is used together with an output angle error in the case where the notch filter is not used. In FIG. 7, the thin line indicates the output angle error in the case where the notch filter is not used, and the thick line indicates the output angle error in the case where the notch filter is used. As can be seen from this drawing, compared with the case where the notch filter is not used (an example of prior art), in the case where the notch filter is used (this example), the output angle error is reduced to about one sixth.

The noise can be further reduced by increasing the width of the notch by reducing the Q value of the notch filter. However, an excessively wide notch may affect the angle calculation loop, so that an optimum Q value has to be selected by taking these tradeoffs into account. Specifically, the Q value preferably falls within a range of 0.5 to 5 and more preferably falls within a range of 0.8 to 1.0.

As described above, in this example, the band elimination filter 35 that eliminates or reduces the low frequency noise (normal mode noise) component occurring due to the effect of the magnetic field produced by the motor and superposed on the resolver signals S1 and S2 is provided between the synchronous detection circuit 34 and the controller 36 in the angle calculation loop in the R/D converter 30, and the noise occurring due to the effect of the magnetic field produced by the motor 20 can be eliminated. Thus, the output angle error of the RID converter 30 can be reduced.

Furthermore, an angle detecting apparatus that comprises the R/D converter 30, the resolver 10 and the excitation signal generating part 40 can accurately detect the angle of rotation of the motor 20.

What is claimed is:

1. An R/D converter converting a detection angle θ implied in a first resolver signal S1 and a second resolver signal S2 outputted from a resolver into a digital angle output φ, comprising:
    a first multiplier multipling said first resolver signal S1 by a sine value of said digital angle output φ, where the resolver outputs said first resolver signal S1 and said second resolver signal S2 in response to an excitation signal, S1=cos θ sin ωt, S2=sin θ cos ωt, sin ω is the excitation signal, and ω is an angular frequency of the excitation signal;
    a second multiplier multipling said second resolver signal S2 by a cosine value of said digital angle output φ;
    a subtracter subtracting an output of said first multiplier from an output of said second multiplier;
    a synchronous detection circuit performing synchronous detection of an output of said subtracter by referring to the excitation signal to output a detected output sin(θ−φ);
    a controller controlling said digital angle output φ to make said detected output sin(θ−φ) as a deviation zero, and outputting said digital angle output φ;
    a SIN ROM generating the sine value of said digital angle output φ from said digital angle output φ; and
    a COS ROM generating the cosine value of said digital angle output φ from said digital angle output φ;
    wherein the R/D converter further comprises a band elimination filter eliminating or reduces a low frequency noise superposed on said resolver signals S1 and S2 between said synchronous detection circuit and said controller.

2. The R/D converter according to claim 1, wherein said low frequency noise is noise superposed by the effect of a magnetic field produced by a motor that is a target of detection of said resolver.

3. The R/D converter according to claim 1, wherein said band elimination filter is intended to eliminate or reduce a noise of a band whose center frequency is the frequency of said excitation signal.

4. The R/D converter according to claim 3, wherein said band includes a frequency equal to said frequency of said excitation signal plus a frequency that is double the frequency of a motor that is a target of detection of said resolver and a frequency equal to said frequency of said excitation signal minus a frequency that is double the frequency of the motor.

5. An angle detecting apparatus, comprising:
    a resolver outputting a first resolver signal S1 and a second resolver signal S2 in response to an excitation signal;
    an R/D converter according to any one of claims 1 to 4; and
    an excitation signal generating part suppling the excitation signal to said resolver and said R/D converter.

* * * * *